United States Patent [19]

Orcutt et al.

[11] Patent Number: 4,496,965
[45] Date of Patent: Jan. 29, 1985

[54] STACKED INTERDIGITATED LEAD FRAME ASSEMBLY

[75] Inventors: John W. Orcutt, Garland; Angus W. Hightower, Richardson; Reginald W. Smith, Arlington, all of Tex.

[73] Assignee: Texas Instruments Incorporated, Dallas, Tex.

[21] Appl. No.: 568,942

[22] Filed: Jan. 9, 1984

Related U.S. Application Data

[63] Continuation of Ser. No. 264,923, May 18, 1981.

[51] Int. Cl.³ .................... H01L 23/48; H01L 23/02; H01L 39/02
[52] U.S. Cl. ........................................ 357/70; 357/81; 357/80
[58] Field of Search ............................. 357/70, 81, 80

[56] References Cited

U.S. PATENT DOCUMENTS

| | | | |
|---|---|---|---|
| 1,649,741 | 11/1927 | Ruben | 357/81 X |
| 3,469,017 | 12/1967 | Starger | 357/70 |
| 3,646,409 | 2/1972 | van de Water et al. | 357/70 |
| 3,676,748 | 7/1972 | Kobayashi et al. | 357/70 |
| 4,079,511 | 3/1978 | Grabbe | 357/70 |
| 4,195,193 | 3/1980 | Grabbe et al. | 357/70 |

FOREIGN PATENT DOCUMENTS

| | | | |
|---|---|---|---|
| 55-12791 | 1/1980 | Japan | 357/70 |
| 56-24955 | 3/1981 | Japan | 357/70 |

Primary Examiner—Andrew J. James
Assistant Examiner—John LaMont
Attorney, Agent, or Firm—N. Rhys Merrett; Melvin Sharp

[57] ABSTRACT

An integrated circuit package having a large number of external connections is assembled using two lead frames stacked one atop the other. The lead frames have complementary lead patterns which interdigitate to provide a very close lead spacing at the periphery of a semiconductor chip on which a complex integrated circuit is fabricated.

2 Claims, 14 Drawing Figures

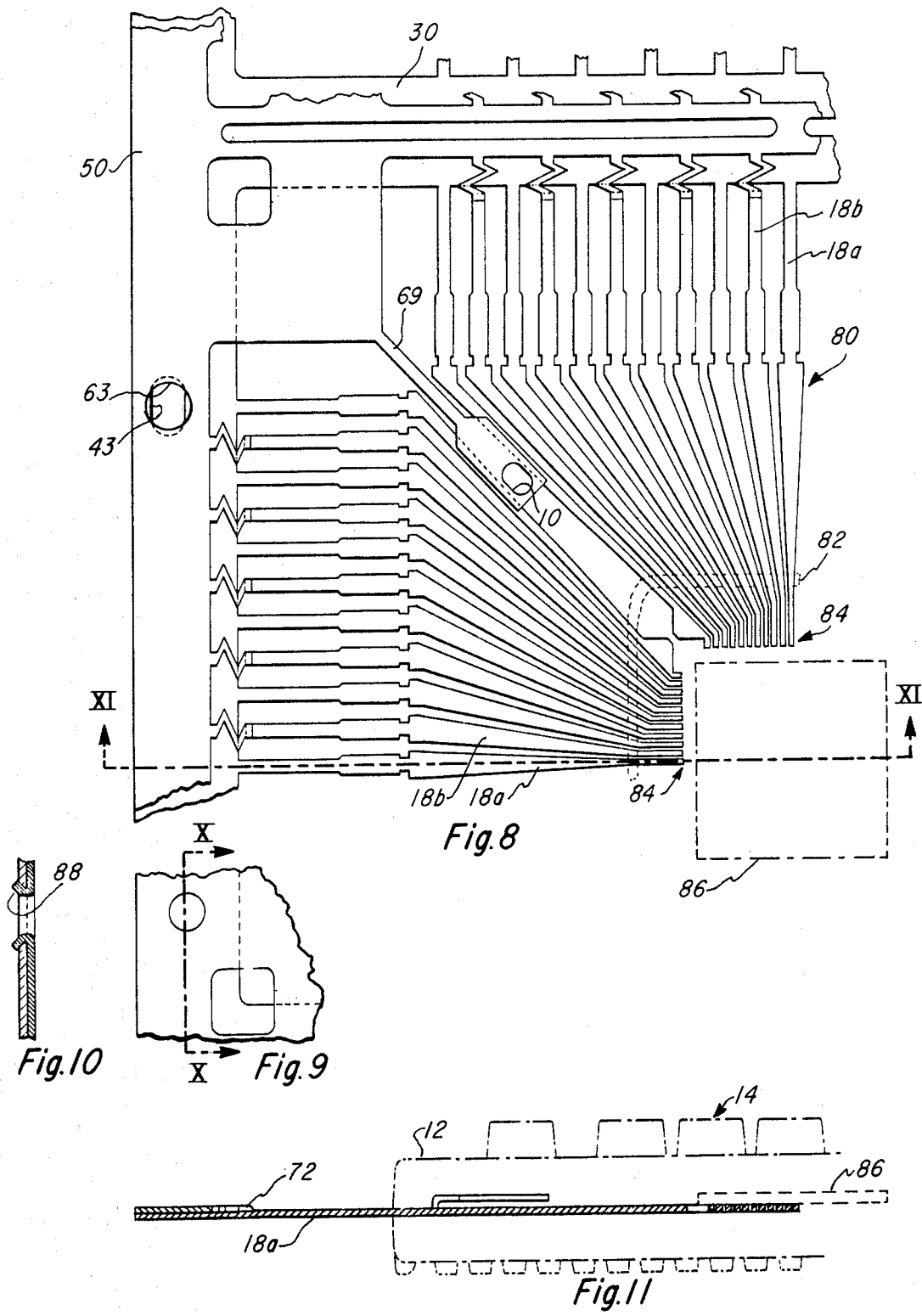

STACKED INTERDIGITATED LEAD FRAME ASSEMBLY

This application is a continuation of application Ser. No. 264,923 filed May 18, 1981.

The present invention pertains generally to semiconductor devices and particularly to the encapuslation of integrated circuit chips.

Advances in the miniaturization and complexity of integrated circuit devices demand corresponding advances in the art of packaging semiconductor chips. The semiconductor package serves to isolate the fragile, electrically-sensitive semiconductor chip from the environment and provide electrical interconnections between the chip and external circuitry.

Integrated circuit devices continue to require ever increasing numbers of external connections. Heretofore, dual in-line packages (DIPs), wherein external connections are made along the two longer edges of a rectangular body, have been the predominant IC packaging vehicle. More recently, chip carriers, wherein external connections are made along the four edges of a square body, have been demonstrated. Chip carriers require less mounting space and have a shorter average internal-external conductive path than DIPs, thereby saving material costs and enabling superior electrical performance.

The principal object of the present invention is the provision of an improved integrated circuit device having a large number of external connections. Although the present invention is described by way of example in the context of a chip carrier, it will be understood that the invention has useful application in the other types of IC packages such as DIPs.

The presently preferred way of carrying out the invention will now be described with reference to the accompanying drawings, in which:

FIG. 8 is a plan view of a portion of the second lead frame overlying a corresponding portion of the first lead frame depicting their relative positions during assembly;

FIG. 9 is a plan view of overlying corner portions of the lead frames;

FIG. 10 is a cross section taken along line X—X of FIG. 9;

FIG. 11 is a cross section taken along line XI—XI of FIG. 8;

Figure 1:
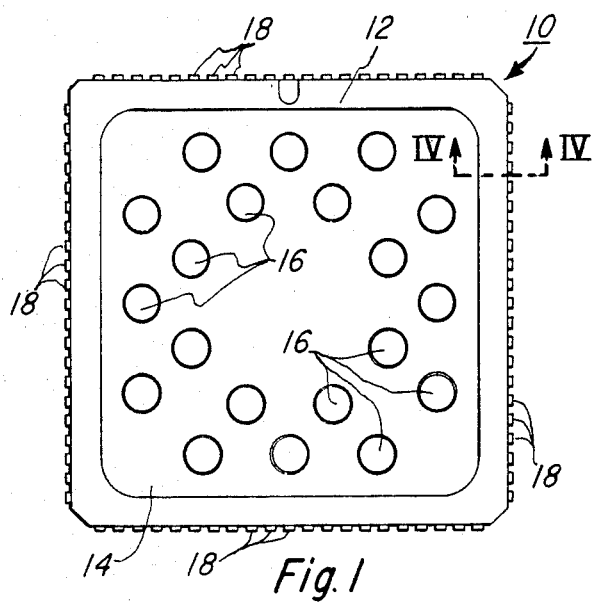
FIG. 1 is a top plan view of a semiconductor package according to the present invention.
Figure 2:
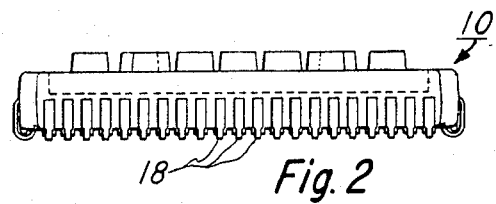
FIG. 2 is a side elevation of the inventive package.
Figure 3:
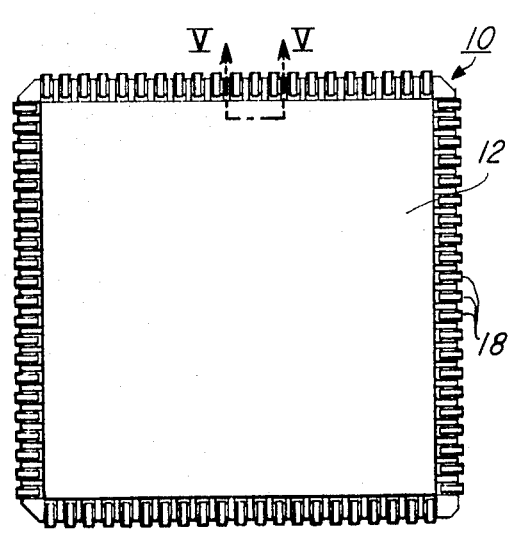
FIG. 3 is a bottom plan view of the inventive package.

Referring to FIGS. 1-3, a chip carrier in accordance with the present invention, is illustrated and designated generally by reference numeral 10. The chip carrier 10 includes a molded plastic body 12 which encapsulates a semiconductor integrated circuit chip (not shown). The chip carrier preferrably includes a heatsink 14 having a plurality of raised generally cylindrical or frustoconical elements 16 which enhance thermal transfer from the chip to the ambient air. A plurality of leads 18 extend out of the body 12 along all four sides of the chip carrier 10. In the present example, there are 21 such leads per side. Each lead 18 is bent downward along the body 12 and then folded over a lip portion 20 at the bottom edge of the body.

Figure 4:
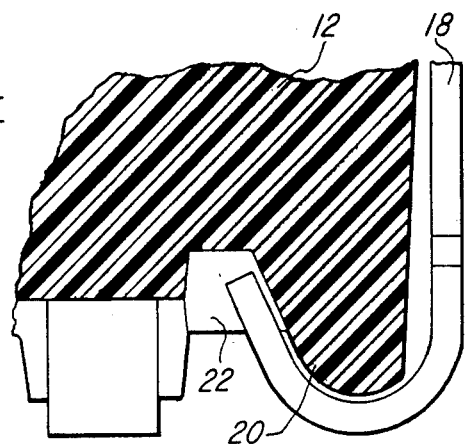
FIG. 4 is a cross section of a portion of the inventive package taken along line IV—IV of FIG. 1.
Figure 5:
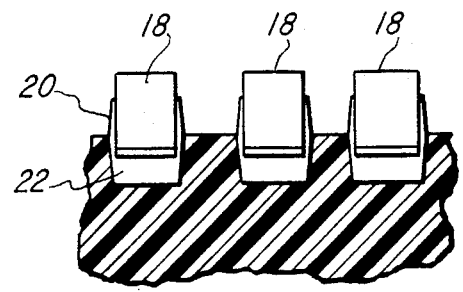
FIG. 5 is a cross section of a portion of the inventive package taken along line V—V of FIG. 3.

The preferred manner in which the leads 18 are formed is seen more clearly in the enlarged views of FIGS. 4 and 5. The end of each lead is bent upward and extends into a corresponding recess 22 in the bottom of the body 12 inward from the lip 20. By nesting the ends of the leads 18 in such recesses 22, lateral movement of the leads and consequent shorting problems are effectively prevented. Each lead 18 preferably fits snugly within its recess 22 as depicted in FIG. 5. Such a tight fit with the sidewalls of the recess keeps the lead anchored in place. Contacts to the leads can be made by mounting the chip carrier 10 on a printed circuit board (not shown) and soldering the bottom curved portion of each lead 18 to a corresponding metal layer on the printed circuit board.

Figure 6:
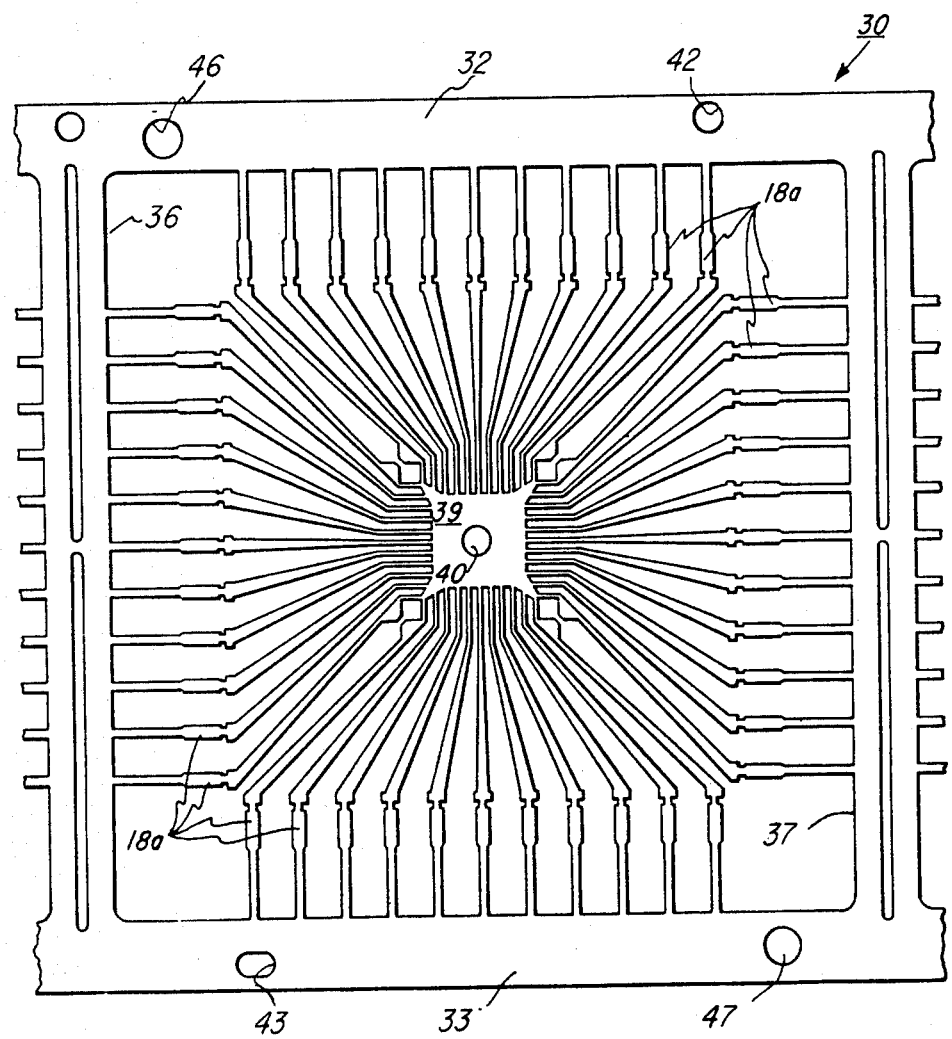
FIGS. 6 and 7 are plan views of first and second lead frames used in assemblying the inventive package.

Referring to FIG. 6, a first lead frame of silver-plated copper is indicated generally by reference numeral 30. The lead frame 30 includes side rails 32 and 33 and cross supports 36 and 37 which form a square framework for supporting a plurality of leads 18a. In particular, there are 44 such leads 18a symmetrically arranged 11 to a side. The leads 18a extend from the side rails and the cross supports to a supporting web 39 which includes a center hole 40. The side rails 32 and 33 include respective alignment holes 42 and 43 and attachment holes 46 and 47.

Figure 7:
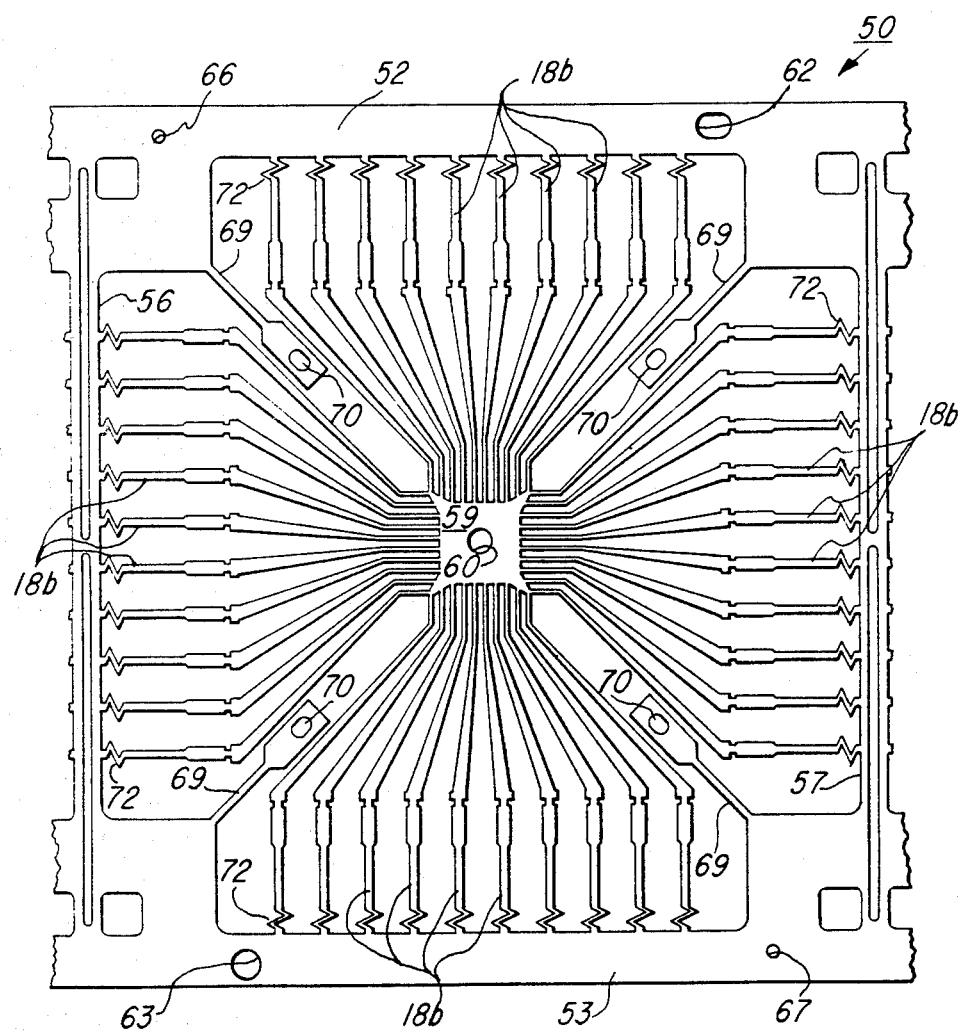

Referring to FIG. 7, a second lead frame of silver-plated copper is indicated generally by reference numeral 50. The lead frame 50 includes side rails 52 and 53 and cross supports 56 and 57 which form a square framework for supporting a plurality of leads 18b. In particular, there are 40 such leads 18b symmetrically arranged 10 to a side. The leads 18b extend from the side rails and cross supports to a supporting web 59 which includes a center hole 60. The side rails 52 and 53 include respective alignment holes 62 and 63 and attachment holes 66 and 67. Extending inward from the corners of the lead frame 50 are four heatsink attachment members 69 each having a slot 70. In accordance with a unique feature of the invention, the ends of the leads 18b include Z-shaped joggle portions 72 connecting the leads to the respective side rails 52 and 53 and cross supports 56 and 57.

Referring to FIGS. 8-10, the manner in which the lead frames 30 and 50 are joined together to form a single 84 pin lead frame assembly 80 will be described. FIG. 8 shows one quadrant of the assembly 80 with the second lead frame 50 lying atop the first lead frame 30. The lead frames are assembled on a fixture (not shown) which includes pins for aligning the lead frames using holes 40, 42, 43, 60, 62 and 63. The leads 18a of the bottom lead frame 30 are interdigitated with the leads 18b of the top lead frame 50 to provide a very close spacing of leads at the center. The center holes 40 and 60 in the webs (FIGS. 6 and 7) are used to maintain precise alignment of the leads during assembly of the lead frames. A strip of insulating epoxy 82 shown in the dashed outline in FIG. 8 is applied to the leads to permit the webs 39 and 59 to be stamped out without disturbing the relative positions of the leads. FIG. 8 shows the position of the interior ends 84 of the leads 18 after removal of the webs. A semiconductor chip 86 is depicted in phantom outline to show its relationship to the lead ends 84.

Assembly of the lead frames 30 and 50 is preferably achieved as follows. The lead frames 30 and 50 are stacked on a fixture having pins (not shown) which extend through corresponding pairs of holes. The center holes 40 and 60 (FIGS. 6 and 7) in the webs constitute one such pair and are critical to the precise alignment of the lead ends 84. FIG. 8 shows a second pair of holes consisting of the slotted hole 43 of the bottom lead frame 30 and the circular hole 63 of the top lead frame 50. Holes 42 and 62 form a similar pair on the opposite side of the lead frame assembly 80 as will be appreciated by considering FIGS. 6 and 7. Once the lead frames are properly aligned, they are rivoted together in the manner depicted in FIGS. 9 and 10. In particular, a pointed cylindrical tool (not shown) is forced through the smaller-diameter hole 67 (FIG. 7) to extrude a portion 88 of the top lead frame 50 through the underlying hole 47 of the bottom lead frame 30. The extruded portion 88 is then rolled over the edge of the hole 47 to provide the structure shown in FIG. 10. The lead frames are also riveted in this manner on the opposite side rails 32 and 52 at the corresponding holes 46 and 66.

Next, referring to FIG. 11, the leads 18b of the top lead frame 50 are brought down to the same level as the leads 18a of the bottom lead frame 30 by bending the top leads 18b at the Z shaped joggles 72. The Z-shape permits stretching to compensate for the step down of the leads 18b at the joggles 72. Then, as previously mentioned, the leads are stablized using the epoxy 82 and the webs 39 and 59 are cut out. Next, the heatsink 14 with the chip 86 mounted thereon is secured to the lead frame assembly 80 and electrical interconnections between the lead ends 84 and the chip 86 are formed. Finally, the plastic body 12 is molded and the leads are trimmed and formed to produce the device structure of FIGS. 1-5, described above.

Figure 12:
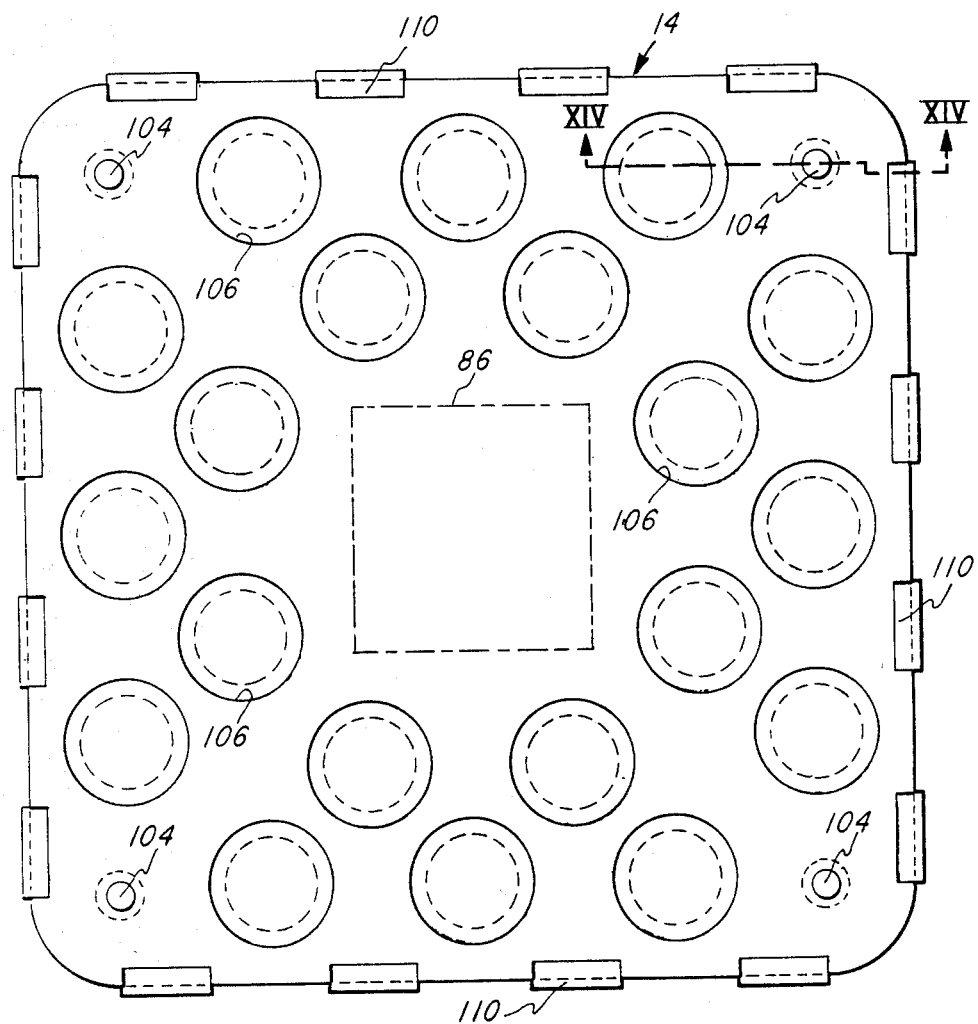
FIG. 12 is a plan view of a heatsink which forms a part of the inventive package.
Figure 13:
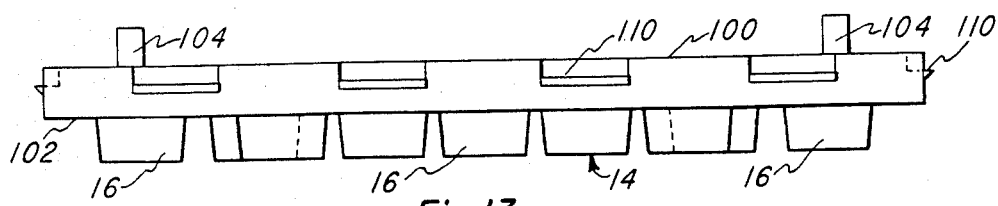
FIG. 13 is a side elevation of the heatsink of FIG. 12.
Figure 14:
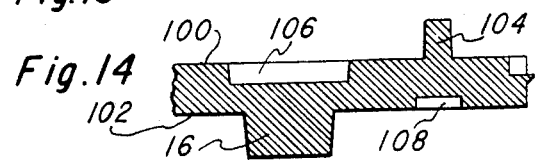
FIG. 14 is a cross section taken along line XIV—XIV of FIG. 12.

The presently preferred heatsink 14 is shown separately in FIGS. 12-14. The heatsink is preferably stamped from a 0.055 inch thick copper plate. A first flat surface 100 has a center portion which forms a mounting pad for the chip 86 shown in phantom outline. A second flat surface 102 forms the top exterior surface of the chip carrier 10. The previously mentioned heat transfer elements 16 extend out from the second surface 102. Extending out from the first surface 100 are four studs 104 which are used to assemble the heatsink 14 to the lead frame assembly 80. The studs are inserted in the slots 70 in the heatsink attachment members 69 (FIG. 7) which are then secured to the heatsink 14 in a suitable manner, such as by soldering. In the fabrication of the heatsink itself, it is preferred that the heat transfer elements 16 and the studs 104 be stamped or press formed using a suitable die (not shown). During each stamping operation corresponding cavities 106 and 108 are formed as seen best in FIG. 14. The die also preferably forms a plurality of notches 110 around the periphery of the heatsink 14 for anchoring the heatsink securely in the plastic body 12.

From the foregoing, it will be apparent that an important feature of this invention is the use of two complementary lead frames 30 and 50. The lead patterns of the lead frames interdigitate to provide a closer lead spacing at the periphery of the semiconductor chip 86 than can be achieved using a single lead frame.

Conventional lead frames are maufactured by stamping or selective etching. In either case, there has been a minimum spacing between leads due to limitations on the size of the stamping tool or in etch definition for a given lead frame thickness. For example, in the present state of the art, the minimum gap between leads for 0.008 inch thick material is 0.0095 inch. It will be appreciated that by using two lead frames and interdigitating the leads in the above described manner, the spacing limitations of stamping or etching do not determine the minimum spacing betwen leads. In the preferred 84-lead arrangement depicted in FIG. 8, 0.007 inch wide lead ends 84 are separated by 0.005 inch gaps. This can readily be achieved using the two leads frames 30 and 50, each of which requires no smaller than 0.017 inch spaces for stamping or etching.

Those skilled in the art will appreciate that significant savings in gold wire used in bonding the leads to the chip can be realized by the present invention. Other incident advantages include improved yields and superior electrical performance due to shorter more uniform gold wire connections.

Altnough a preferred embodiment of the invention has been described in detail, it is to be understood that various changes, substitutions and alterations can be made therein without departing from the spirit and the scope of the invention as defined in the appended claims.

What is claimed is:

1. A lead frame assembly for an integrated circuit device comprising:
   a first lead frame having opposed side rails and a first group of leads extending inward from each side rail; and
   a second lead frame disposed atop and in contact with the first lead frame, the second lead frame having opposed side rails and a second group of leads extending inward therefrom, wherein each lead in the second group of leads includes a joggled section near its associated side rail and wherein the second group of leads is staggered in relationship to the first group of leads so that the leads of the second group lie between and substantially coplanar with adjacent leads of the first group.

2. The lead frame assembly of claim 1, further comprising a heat sink for supporting a semiconductor integrated circuit chip wherin said heat sink is anchored to at least one of said lead frames, said heat sink including a plurality of raised, generally frustoconical heat transfer elements extending outward from a surface thereof away from said integrated circuit chip.

* * * * *